United States Patent
Rodriguez

(10) Patent No.: US 10,379,550 B2
(45) Date of Patent: *Aug. 13, 2019

(54) SCALABLE PANEL COOLING SYSTEM

(71) Applicant: International Business Machines Corporation, Armonk, NY (US)

(72) Inventor: Jean-Michel Rodriguez, Mauguio (FR)

(73) Assignee: International Business Machines Corporation, Armonk, NY (US)

(*) Notice: Subject to any disclaimer, the term of this patent is extended or adjusted under 35 U.S.C. 154(b) by 254 days.

This patent is subject to a terminal disclaimer.

(21) Appl. No.: 15/586,422

(22) Filed: May 4, 2017

(65) Prior Publication Data

US 2017/0235319 A1 Aug. 17, 2017

Related U.S. Application Data

(63) Continuation of application No. 15/248,580, filed on Aug. 26, 2016, now Pat. No. 9,720,463, which is a (Continued)

(30) Foreign Application Priority Data

Jun. 4, 2013 (GB) .................................. 1309941.1

(51) Int. Cl.
*H05K 7/20* (2006.01)
*G05D 23/19* (2006.01)
(Continued)

(52) U.S. Cl.
CPC ......... *G05D 23/1917* (2013.01); *G05B 15/02* (2013.01); *G06F 1/20* (2013.01); *H05K 7/20781* (2013.01)

(58) Field of Classification Search
None
See application file for complete search history.

(56) References Cited

U.S. PATENT DOCUMENTS

| 5,509,468 A | 4/1996 | Lopez |
| 8,250,877 B2 | 8/2012 | Correa et al. |

(Continued)

FOREIGN PATENT DOCUMENTS

| GB | 2514799 A1 | 10/2014 |
| JP | 2010263105 A | 11/2010 |

(Continued)

OTHER PUBLICATIONS

Udakeri et al., "Comparison of Overhead Supply and Underfloor Supply with Rear Heat Exchanger in High Density Data Centers Clusters", 24th IEEE Semi-Therm Symposium, 2008, 8 pages.
(Continued)

*Primary Examiner* — Philip Wang
(74) *Attorney, Agent, or Firm* — Daniel Simek; Hoffman Warnick LLC

(57) ABSTRACT

Method and system are provided for controlling a scalable panel cooling system having multiple cooling panels for cooling heat-generating components housed in a support structure. The method includes: dividing the support structure into areas, each area of the support structure capable of housing a heat-generating component; for each area of the support structure: providing a cooling panel adjacent the area of the support structure; determining whether the area of the support structure is housing an operational heat-generating component; in the case that the area of the support structure is housing an operational heat-generating component, activating the cooling panel adjacent the area of the support structure housing the operational heat-generating component; and in the case that the area of the support structure is not housing a operational heat-generating component, deactivating the cooling panel adjacent the area of the support structure.

18 Claims, 5 Drawing Sheets

Related U.S. Application Data continuation of application No. 14/256,053, filed on Apr. 18, 2014, now Pat. No. 9,497,893.

(51) Int. Cl.
    *G05B 15/02*     (2006.01)
    *G06F 1/20*     (2006.01)

(56) References Cited

U.S. PATENT DOCUMENTS

| | | |
|---|---|---|
| 2003/0147214 A1 | 8/2003 | Patel et al. |
| 2004/0109288 A1 | 6/2004 | Beitelmal et al. |
| 2004/0221604 A1 | 11/2004 | Ota et al. |
| 2008/0092577 A1* | 4/2008 | Martin ............... G06F 1/206 62/259.2 |
| 2008/0232064 A1* | 9/2008 | Sato ............... H05K 7/20754 361/679.49 |
| 2009/0302124 A1 | 12/2009 | Dawson et al. |
| 2011/0060470 A1 | 3/2011 | Campbell et al. |
| 2012/0201005 A1 | 8/2012 | Barringer et al. |
| 2012/0203381 A1* | 8/2012 | Shah ............... H05K 7/20836 700/277 |
| 2012/0300391 A1 | 11/2012 | Keisling et al. |
| 2013/0098593 A1* | 4/2013 | Busch ............... H05K 7/20209 165/200 |
| 2013/0233532 A1* | 9/2013 | Imwalle ............... F28F 27/02 165/287 |
| 2014/0297855 A1* | 10/2014 | Moore ............... G06Q 10/087 709/224 |

FOREIGN PATENT DOCUMENTS

| | | |
|---|---|---|
| JP | 2012523114 A | 9/2012 |
| WO | 2011141710 A1 | 11/2011 |

OTHER PUBLICATIONS

Application No. GB1309941.1, Search Report, dated Nov. 8, 2013, 4 pages.

Ellsworth et al., "An Overview of the IBM Power 775 Supercomputer Water Cooling System", Journal of Electronic Packaging, vol. 134, Issue 2, Jun. 11, 2012, 9 pages.

Notice of Allowance for U.S. Appl. No. 14/256,053, filed Apr. 18, 2014; 13 Pages.

Notice of Allowance dated Mar. 22, 2017 for U.S. Appl. No. 15/248,580, filed Aug. 26, 2016; 14 Pages.

\* cited by examiner

SCALABLE PANEL COOLING SYSTEM

TECHNICAL FIELD

This invention relates to the field of cooling systems for computing devices. In particular, the invention relates to a scalable panel cooling system.

RELATED ART

Rack frame mounting systems for hardware components are used in a large number of environments in which multiple hardware components are stacked either vertically or horizontally in an enclosure. In the case of horizontally stacked components, the rack frame mounting system is commonly referred to as a blade system. Rack frame mounting systems are commonly used in data centers to house computer hardware in dense hardware configurations. For example, the computer hardware may be in the form of servers, storage units, etc.

Rack frame mounting systems are also used for hardware systems other than computing systems, such as telecommunications, audio, video, entertainment, etc.

Densely configured hardware components, in particular, computer servers and other large high-performance computer systems, generate a large amount of heat when operating which requires cooling. In some situations, the room in which the hardware components are situated may be cooled. Cooling systems may also be integral to the hardware components. Additionally, rack or blade frame housing systems may include a cooling panel, for example, at the back of rack or blade system.

More and more computer servers are being housed in a central location, for example, to provide Internet provider services, cloud computing, central storage, corporate server rooms, etc.

One known cooling solution is to provide a rear door heat exchanger for a rack or blade frame mounting system. The rear door, which may be openable, is formed with an integral heat exchanger which covers the whole back panel of the system. This has the problem that it is an all or nothing solution. Consequently, if the rack is not full of hardware components this cooling solution wastes lot of cooling energy.

SUMMARY

According to a first aspect there is provided a method for controlling a scalable panel cooling system having multiple cooling panels for cooling heat-generating components housed support structure, including: dividing a support structure into areas, each area capable of housing a heat-generating component; providing a cooling panel adjacent an area of the support structure; determining whether an area of the support structure is housing an operational heat-generating component; activating a cooling panel adjacent an area housing an operational heat-generating component; and deactivating a cooling panel adjacent an area not housing an operational heat-generating component.

The method may include monitoring the multiple cooling panels to determine if a cooling panel is not functioning correctly.

The method may further include providing arrangement suggestions to optimise the use of cooling panel redundancy if one or more cooling panels are not functioning correctly.

The method may include: determining a position of a non-functioning cooling panel; determining a position of a non-activated cooling panel adjacent an area not housing a non-operational heat-generating component; suggesting moving a heat-generating component from an area adjacent a non-functioning cooling panel to a position in an area adjacent a previously non-activated functioning cooling panel.

The method may include activating a previously deactivated cooling panel if an operational heat-generating component is moved to an area adjacent the previously deactivated cooling panel. Activating a cooling panel may be carried out by switching a valve or switch for the cooling panel.

According to a second aspect there is provided a scalable panel cooling system for a support structure for mounting heat-generating components, including: a support structure having multiple areas, each area capable of housing a heat-generating component; a plurality of cooling panels, wherein each cooling panel is adjacent an area of the support structure and is operable to cool any heat-generating component housed in the area; a plurality of sensors for sensing whether an area of the support structure is housing an operational heat-generating component; and a controller for activating a cooling panel adjacent an area housing an operational heat-generating component and deactivating a cooling panel adjacent an area not housing an operational heat-generating component.

The system may include a plurality of monitors for monitoring the plurality of cooling panels to determine if a cooling panel is not functioning correctly.

The controller may include a rack arrangement suggestion component for providing arrangement suggestions to optimise the use of cooling panel redundancy if one or more cooling panels are not functioning correctly.

The controller may include: a position determining component for: determining a position of a non-functioning cooling panel; and determining a position of a non-activated cooling panel adjacent an area not housing a non-operational heat-generating component; the controller may further include: a rack arrangement suggestion component for suggesting moving a heat-generating component from an area adjacent a non-functioning cooling panel to a position in an area adjacent a previously non-activated functioning cooling panel.

The controller may include a panel activation component for activating a previously de-activated cooling panel if an operational heat-generating component is moved to an area adjacent the previously deactivated cooling panel.

Each cooling panel may have a valve or switch for activating and deactivating the cooling panel remotely by the controller.

The multiple cooling panels may be mounted to form a side of a support structure. The side of the rack mounting frame may be a back door providing access to the heat-generating components housed by the support structure.

A cooling panel may be adjacent an individual area of a support structure for housing a heat-generating component.

The multiple cooling panels may be spaced apart in the side of a support structure.

According to a third aspect there is provided a computer program product for controlling a scalable panel cooling system, the computer program product comprising: a non-transitory computer readable storage medium readable by a processing circuit and storing instructions for execution by the processing circuit for performing a method according to the first aspect.

According to a fourth aspect there is provided a computer program stored on a non-transitory computer readable medium and loadable into the internal memory of a digital computer, comprising software code portions, when said program is run on a computer, for performing the method of the first aspect of the present invention.

According to a fifth aspect there is provided a method substantially as described with reference to the figures.

According to a sixth aspect there is provided a system substantially as described with reference to the figures.

The described aspects of the invention provide the advantage of minimizing a number of cooling panels to be activated and thereby selectively reducing the amount of cooling energy required based on the usage of the rack mounting frame system.

BRIEF DESCRIPTION OF THE DRAWINGS

The subject matter regarded as the invention is particularly pointed out and distinctly claimed in the concluding portion of the specification. The invention, both as to organization and method of operation, together with objects, features, and advantages thereof, may best be understood by reference to the following detailed description when read with the accompanying drawings.

Embodiments of the present invention will now be described, by way of example only, with reference to the following drawings.

DETAILED DESCRIPTION

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

A method and system are provided for automatically adapting a cooling panel system of a support structure in the form of a rack frame mounting system according to the arrangement of heat-generating components in the rack. The method may take into account whether the rack is full or not, and the sub-configuration. Empty space in the rack, will not be cooled by the cooling panel system preventing unnecessary cooling and wasting of cooling energy.

Multiple panels providing divided or sub-cooling capacities for a panel area are provided combined with a degree of automation for selecting which of the multiple panels to activate.

The described system may replace an existing rear cooling panel of a mounting rack with multiple smaller panels with electronic valves allowing the selection of which panel to activate for cooling.

The provision of multiple smaller cooling panels reduces the amount of energy used for the cooling; directing the cooling where it is needed.

The cooling panels may be heat exchangers in the form of pipe cooling systems, or plate cooling systems, or any form of cooling system that provides cooling to an area adjacent hardware components.

In addition, the described system may help the cooling redundancy in the rack. If the rack is not full and one panel is failing, hardware components may be moved to the cooled locations in the rack.

In another aspect, the number of rear panels required for a rack may be reduced by positioning the rear panels without covering all the back of the rack.

Figure 1:
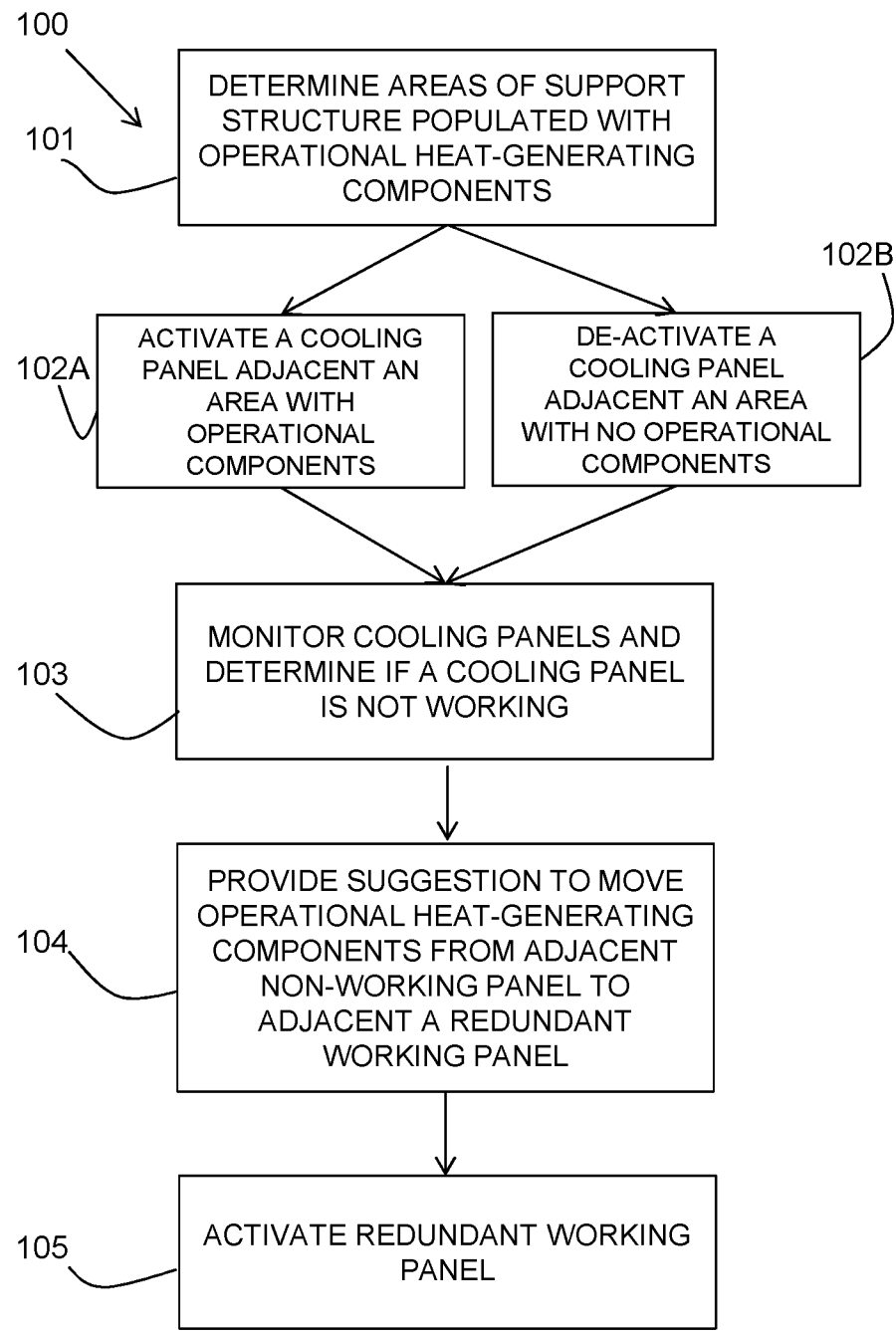
FIG. 1 is a flow diagram of an example embodiment of a method in accordance with the present invention.

Referring to FIG. 1, a flow diagram 100 shows an embodiment of the described method.

A support structure may be provided for housing heat-generating components, such as hardware components for computing, audio, video, entertainment, etc. These components are referred to as heat-generating components as they generate heat when operating. The components may have their own internal cooling system; however, the area around the heat-generating components may also need to be cooled to prevent a build up of heat.

The support structure may be a rack or frame mounting structure divided into areas, each area capable of housing one or more heat-generating components. Each area of the support structure may be provided with a cooling panel adjacent the area such that the cooling effect cools any heat-generating components housed in the area of the support structure.

The described method may determine 101 which areas of the support structure are populated with or house operational heat-generating components. Operational heat-generating components are components that are working and therefore producing heat during their operation. The step of determining 101 areas which are populated may be carried out by multiple sensors being provided to sense the presence and, optionally, operation of hardware components. This may be through heat sensing, sensing the physical presence of the hardware component, sound sensing, etc.

In one embodiment, the presence of hardware components may be determined regardless of whether or not the hardware component is operational. In another embodiment, the presence of only operational hardware components may be determined so that cooling is not applied to dormant non-operational hardware components.

Control of the cooling panels adjacent the different areas of the support structure may be provided. The control may include activating 102A a cooling panel adjacent an area housing one or more operational heat-generating components and deactivating 102B a cooling panel adjacent an area housing no operational heat-generating components. The term activation may include maintaining the operation of a cooling panel as well as starting up a cooling panel. The term deactivation may include not starting up a cooling panel as well as shutting down a cooling panel.

A minimum possible number of cooling panels may be activated with the activated panels being adjacent the operational components. In this way, if a rack is full and all the components in the rack are operational, then all the cooling panels may be activated. However, if the rack is partly empty, or some of the components are not currently being used, then only selected cooling panels may be activated. The activation of selected cooling panels may be carried out by remote automated operation of selected values or controls of each panel.

The individual cooling panels may be monitored 103 to determine if a cooling panel is not working correctly. This may be carried out by monitoring the temperature of each cooling panel or a temperature in the vicinity of each cooling panel.

If it is determined that one or more cooling panels are not working correctly, automated suggestions may be provided 104 for the rearrangement of the components in the rack. For example, if there is redundancy in the support structure or rack due to one or more non-operational components or empty slots, the operational components may be moved to the positions of the non-operational components or empty slots away from the faulty cooling panel to the redundant cooling panel.

The previously redundant cooling panel may be activated 105 enabling the faulty cooling panel to be replaced or repaired.

Figure 2A:
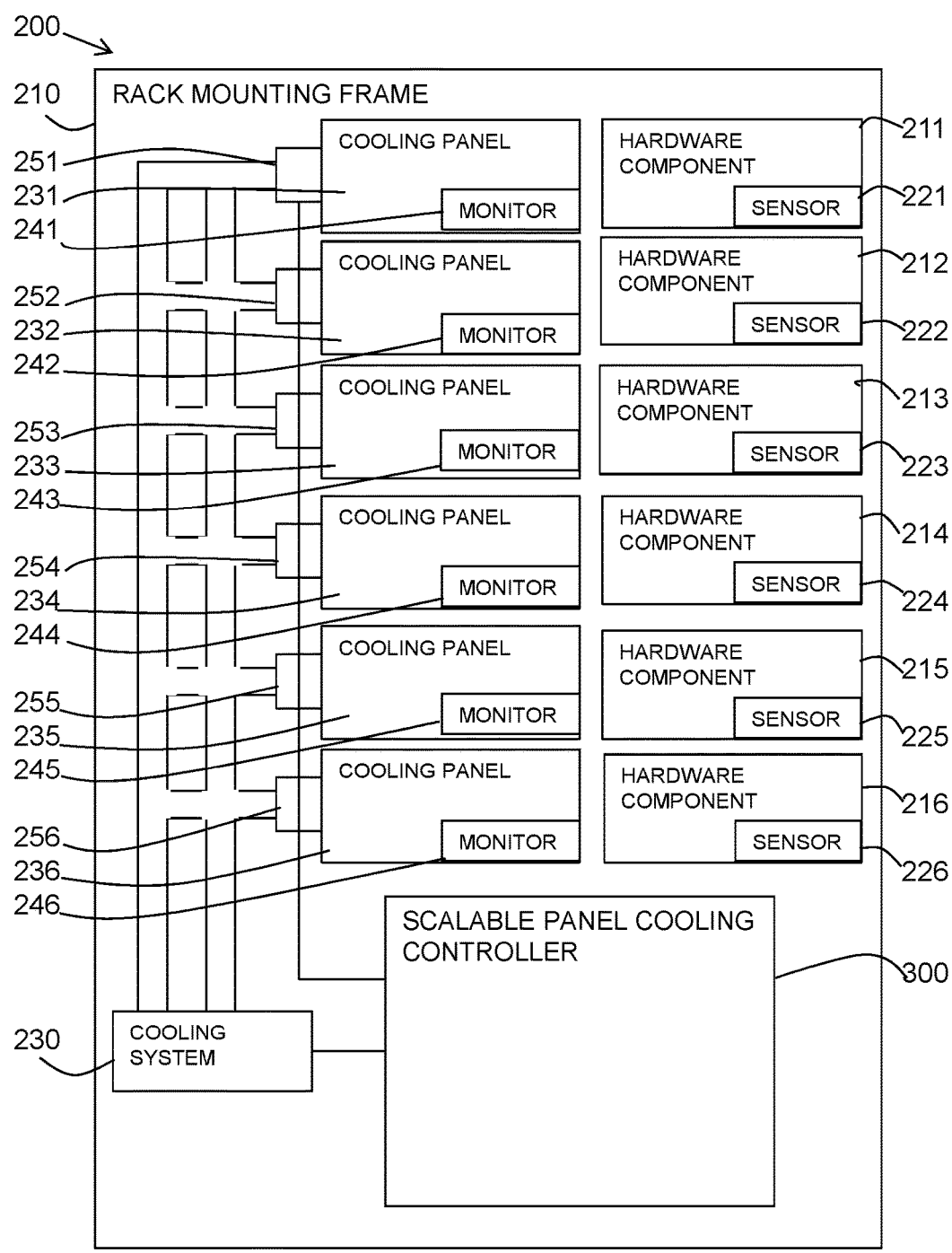
FIGS. 2A and 2B are schematic diagrams showing an example embodiment of a system in accordance with the present invention.
Figure 2B:
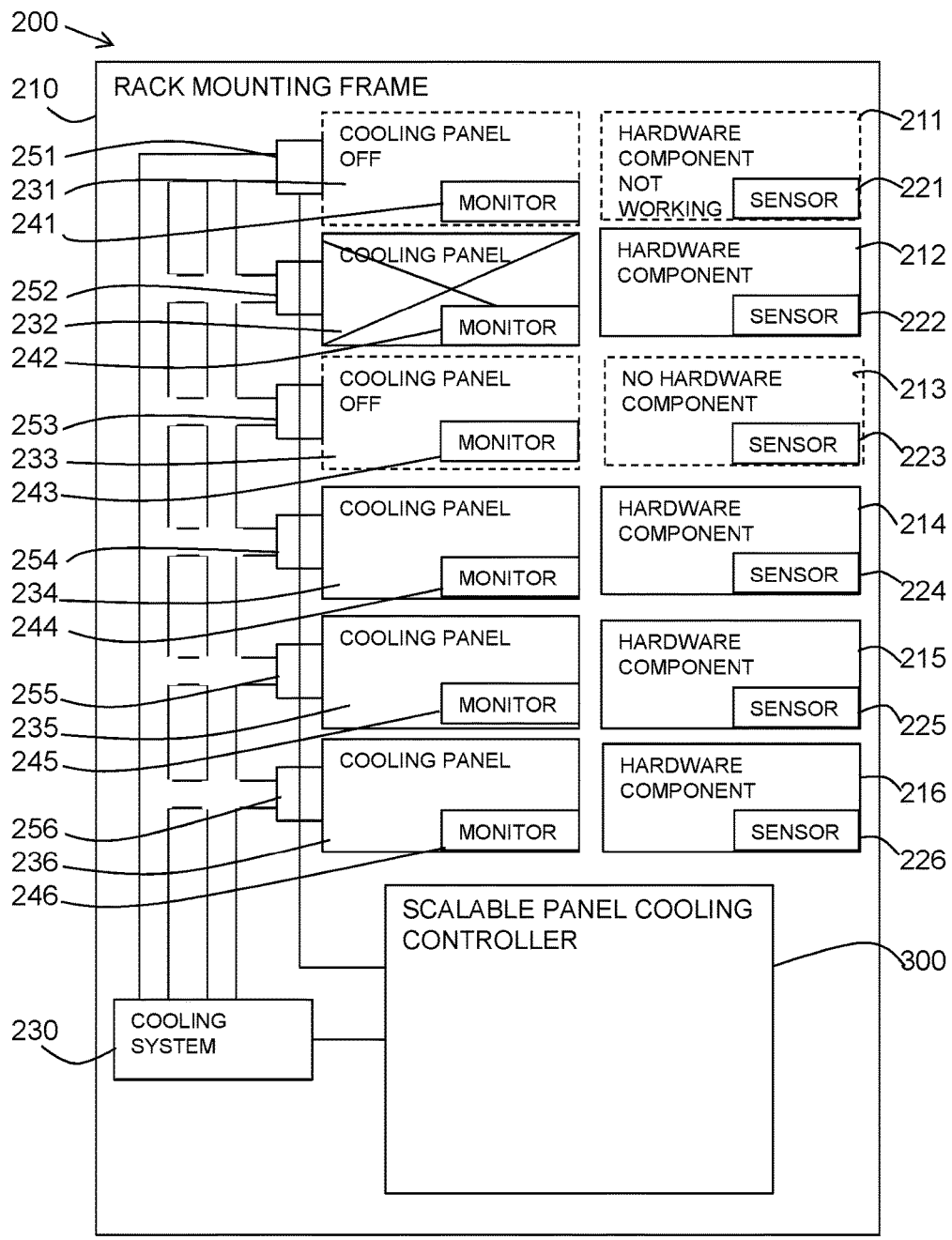

Referring to FIGS. 2A and 2B an example embodiment of the described system is shown in two operational states.

FIGS. 2A and 2B show a system 200 including a support structure in the form of a rack mounting 210 for housing multiple hardware components 211-216. The hardware components 211-216 may be computer, audio, video, entertainment components. In one example, the rack 210 may house computer servers either stacked horizontally or vertically in a blade server arrangement.

Each of the areas where the hardware components 211-216 are housed in the rack 210 may include a sensor 221-216 for sensing if there is a hardware component 211-216 at a particular location in the rack 210 and/or if a hardware component 211-216 is operating.

The rack 210 includes one side which is made up of multiple cooling panels 231-236. The side of the rack 210 may be the back and may include a frame which is openable to provide access to the interior of the rack 210.

The cooling panels 231-236 are situated adjacent to the hardware components 211-216 so that the cooling effect is applied to the hardware components 211-216. There may be a one-to-one relationship between the panels 231-236 and the housings for hardware components 211-216 such that there is a cooling panel 231 for a hardware component 211. Alternatively, a cooling panel 231-236 may be adjacent two or more hardware components 211-216.

In one embodiment, the cooling panels 231-236 may be spaced apart so that less cooling panels 231-236 are needed to cover the side of the rack 210.

Each cooling panel 231-236 may include a monitor 241-246 to monitor the function of the cooling panel, for example, by monitoring the temperature of the cooling panel 231-236.

The cooling panels 231-236 may use any form of cooling mechanism. In one embodiment, the cooling panels 231-236 may include pipes of liquid coolant, such as water, refrigerant etc. The pipes may carry the liquid coolant around the panel area from a cooling system 230. In another embodiment, the cooling panels 231-236 may be plate cooling mechanisms.

A scalable panel cooling controller 300 may be provided for controlling the operation of the cooling panels 231-236 according to the position and operation of the hardware components 211-216. The controller 300 may be integral to the rack 210 or remote to the rack 210, for example, providing control of multiple racks 210 remotely. The controller 300 is described further in relation to FIG. 3 below. The controller 300 may receive input from the sensors 221-226 regarding the position and operation of the hardware components 211-216 in the rack 210. The controller 300 may also receive input from the monitors 241-246 of the cooling panels 231-236 so that it is aware of any non-functioning cooling panels 231-236. The controller 300 may activate/deactivate each cooling panel 231-236 individually by operation of valves 251-256 in the cooling system 230 or by switches. The controller 300 may suggest optimised arrangements of the hardware components 211-216 in the rack 210.

FIG. 2A shows a full rack 210 with hardware components 211-216 stacked adjacent cooling panels 231-236.

In FIG. 2B, an arrangement is shown in which one housing 213 does not contain a hardware component and one of the hardware components 211 is not operational. The controller 300 may de-activate the cooling panels 231, 233 adjacent the empty housing 213 and adjacent the non-operational hardware component 211.

In addition, one of the cooling panels 232 is monitored as not working correctly and needs to be powered down.

The controller 300 may switch off the non-functioning cooling panel 232 and may suggest moving the operational hardware component 212 from adjacent the non-functioning cooling panel 232 to a housing adjacent an operational cooling panel 233 where there is currently no hardware component and activating the cooling panel 233.

Figure 3:
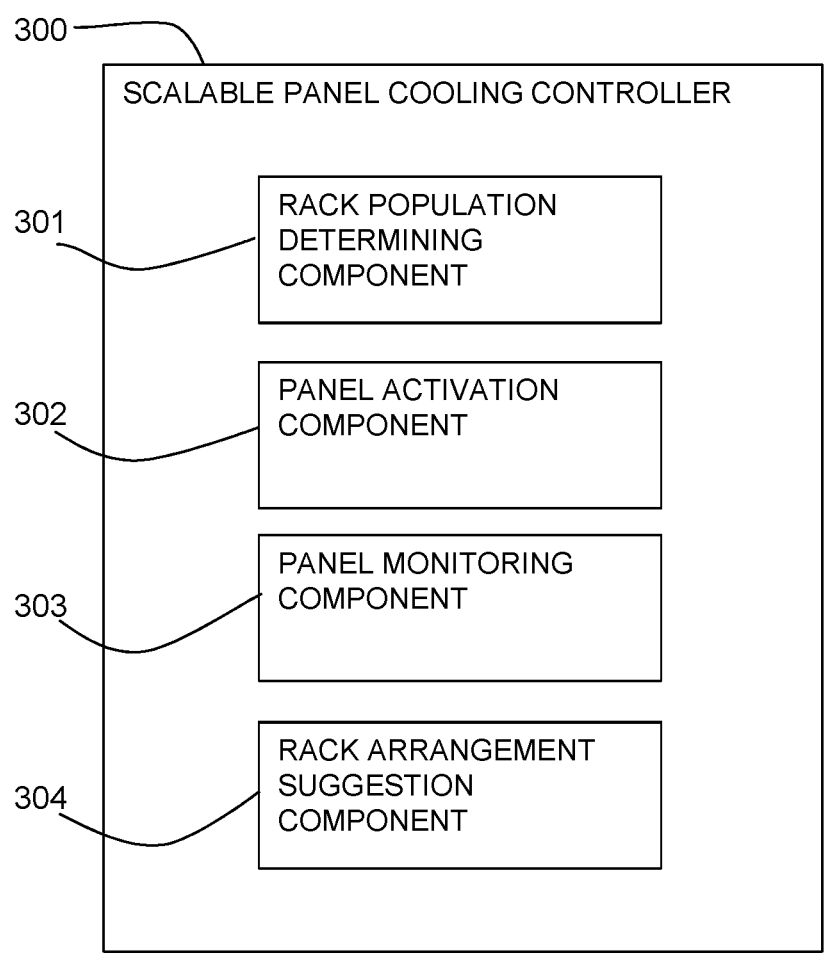
FIG. 3 is block diagram of an example embodiment of a system in accordance with the present invention.

Referring to FIG. 3, a block diagram shows an example embodiment of the described scalable panel cooling controller 300.

The scalable panel cooling controller 300 may control multiple cooling panels provided adjacent heat-generating components in a support structure such as a rack frame mounting system. The controller 300 may include a rack population determining component 301 which may receive inputs from sensors in the rack sensing the presence and/or operation of the heat-generating devices.

The controller 300 may also include a panel activation component 302 for individually activating or de-activating panels according to the required cooling.

A panel monitoring component 303 may also be provided for monitoring is the individual panels are operating correctly. The panel monitoring component 303 may receive input from panel monitors, for example, monitoring the panel temperature to ensure it is working correctly.

A rack arrangement suggestion component 304 may be provided for suggesting alteration to the arrangement of heat-generating devices in the rack according to the operation of the cooling panels. This may take advantage of any redundant cooling panels in a rack if another cooling panel is not working.

Figure 4:
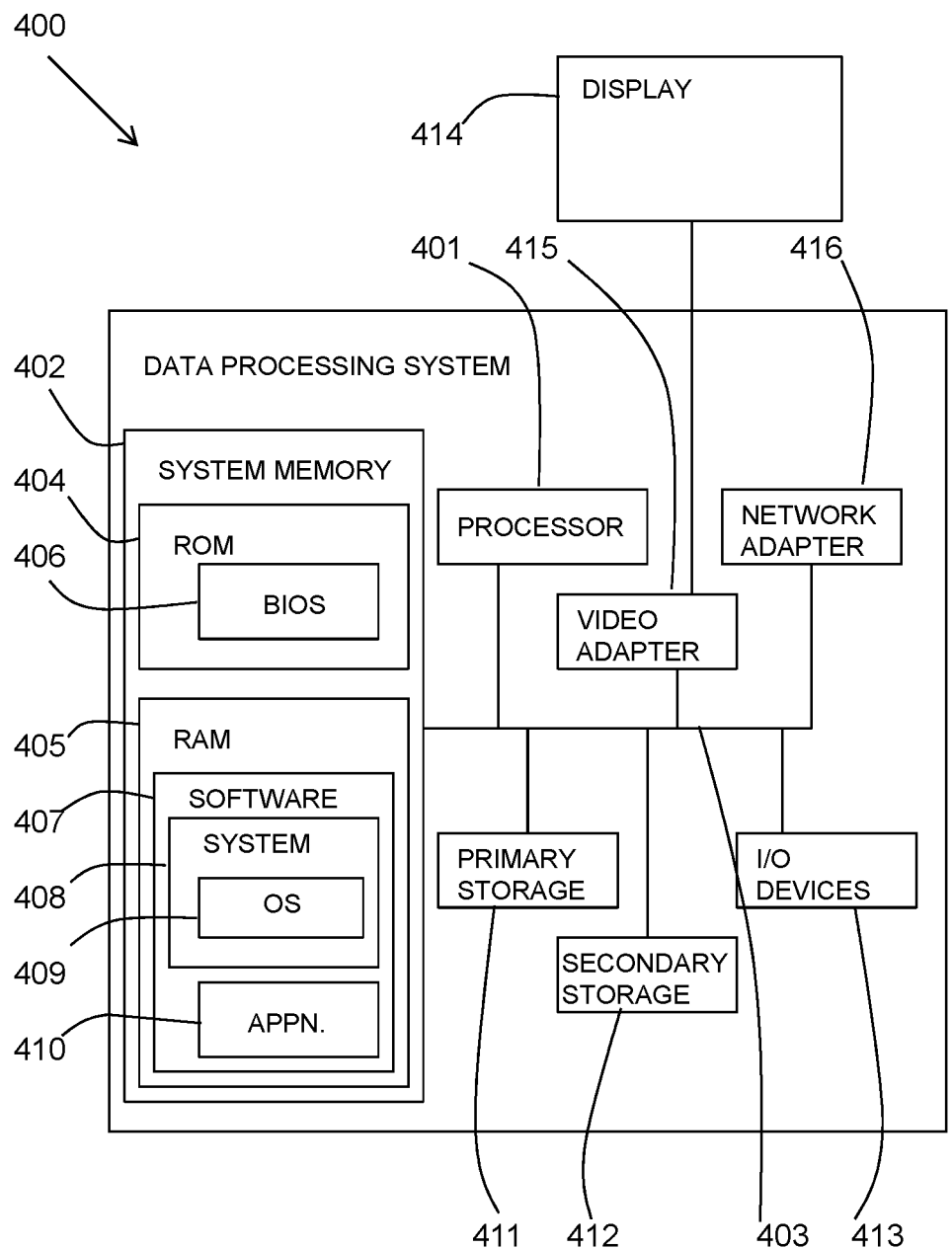
FIG. 4 is a block diagram of an embodiment of a computer system in which the present invention may be implemented.

Referring to FIG. 4, an exemplary system for implementing aspects of the invention includes a data processing system 400 suitable for storing and/or executing program code including at least one processor 401 coupled directly or indirectly to memory elements through a bus system 403. The memory elements may include local memory employed during actual execution of the program code, bulk storage, and cache memories which provide temporary storage of at least some program code in order to reduce the number of times code must be retrieved from bulk storage during execution.

The memory elements may include system memory 402 in the form of read only memory (ROM) 404 and random access memory (RAM) 405. A basic input/output system (BIOS) 406 may be stored in ROM 404. System software 407 may be stored in RAM 405 including operating system software 408. Software applications 410 may also be stored in RAM 405.

The system 400 may also include a primary storage means 411 such as a magnetic hard disk drive and secondary storage means 412 such as a magnetic disc drive and an optical disc drive. The drives and their associated computer-readable media provide non-volatile storage of computer-executable instructions, data structures, program modules and other data for the system 400. Software applications may be stored on the primary and secondary storage means 411, 412 as well as the system memory 402.

The computing system 400 may operate in a networked environment using logical connections to one or more remote computers via a network adapter 416.

Input/output devices 413 may be coupled to the system either directly or through intervening I/O controllers. A user may enter commands and information into the system 400 through input devices such as a keyboard, pointing device, or other input devices (for example, microphone, joy stick, game pad, satellite dish, scanner, or the like). Output devices may include speakers, printers, etc. A display device 414 is also connected to system bus 403 via an interface, such as video adapter 415.

The described solution does not require a rack empty space to be filled with a blanking plate or any devices to prevent cooling and little manual intervention is required. Power can be saved in data centers and other environments using the described method and system for non-full racks and racks with powered-off components.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

The invention can take the form of a computer program product accessible from a computer-usable or computer-readable medium providing program code for use by or in connection with a computer or any instruction execution system. For the purposes of this description, a computer usable or computer readable medium can be any apparatus that can contain, store, communicate, propagate, or transport the program for use by or in connection with the instruction execution system, apparatus or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read only memory (ROM), a rigid magnetic disk and an optical disk. Current examples of optical disks include compact disk read only memory (CD-ROM), compact disk read/write (CD-R/W), and DVD.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual skilled in the art are included within the scope of the invention as defined by the accompanying claims.

The invention claimed is:

1. A method for controlling a cooling system having multiple cooling panels for cooling heat-generating components housed in a support structure, the support structure divided into areas capable of housing a heat-generating component, the method comprising:
    monitoring the multiple cooling panels to determine if any of the cooling panels is not functioning correctly;
    determining whether an area of the support structure is housing an operational heat-generating component; and
    in the case that the area of the support structure is housing an operational heat-generating component, activating an cooling panel adjacent the area of the support structure housing the operational heat-generating component.

2. The method as claimed in claim 1, further comprising, in the case that the area of the support structure is not housing a operational heat-generating component, deactivating the cooling panel adjacent the area of the support structure.

3. The method as claimed in claim 1, further comprising providing arrangement suggestions to optimise cooling panel redundancy if any of the cooling panels are not functioning correctly.

4. The method as claimed in claim 1, further comprising:
    determining a position of a non-functioning cooling panel;
    determining a position of a non-activated cooling panel adjacent an area of the support structure housing no or a non-operational heat-generating component; and
    suggesting moving a heat-generating component from an area of the support structure adjacent a non-functioning cooling panel to an area of the support structure adjacent a previously non-activated functioning cooling panel.

5. The method as claimed in claim 1, further comprising activating a previously deactivated cooling panel if an operational heat-generating component is moved to an area adjacent the previously deactivated cooling panel.

6. A cooling system for a support structure having multiple areas for mounting heat-generating components, comprising:
    a sensor for sensing an operational heat-generating component in an area of the support structure;
    a controller for activating a cooling panel adjacent the area of the support structure housing the operational heat-generating component; and
    a monitor for monitoring the cooling panel to determine if the cooling panel is not functioning correctly.

7. The system as claimed in claim 6, wherein the controller deactivates a cooling panel adjacent an area of the support structure not housing an operational heat-generating component.

8. The system as claimed in claim 6, wherein the controller further comprises a rack arrangement suggestion component for providing arrangement suggestions to optimise the use of cooling panel redundancy if the cooling panel is not functioning correctly.

9. The system as claimed in claim 6, wherein the controller further comprises:
    a position determining component for:
        determining a position of a non-functioning cooling panel; and
        determining a position of a non-activated cooling panel adjacent an area of the support structure not housing a non-operational heat-generating component;
    and wherein the controller further comprises:
    a rack arrangement suggestion component for suggesting moving a heat-generating component from an area of the support structure adjacent a non-functioning cooling panel to a position in an area of the support structure adjacent a previously non-activated functioning cooling panel.

10. The system as claimed in claim 9, wherein the cooling panel is adjacent an individual area of the support structure for housing a single heat-generating component.

11. The system as claimed in claim 6, wherein the controller further comprises:
a panel activation component for activating a previously deactivated cooling panel if the operational heat-generating component is moved to an area of the support structure adjacent the previously deactivated cooling panel.

12. The system as claimed in claim 6, wherein the cooling panel has a valve or switch for activating and deactivating the cooling panel remotely by the controller.

13. The system as claimed in claim 6, wherein the cooling panel is mounted to a side of the support structure.

14. The system as claimed in claim 13, wherein the side of the support structure is a back door providing access to components housed by the support structure.

15. The system as claimed in claim 13, further including a plurality of the cooling panels, wherein the cooling panels are spaced apart along the side of the support structure.

16. A computer program product including program code embodied in at least one computer-readable hardware storage device, which when executed, enables a computer system to implement a method for controlling a cooling system having multiple cooling panels for cooling heat-generating components housed in a support structure, the method comprising:

monitoring the multiple cooling panels to determine if any of the cooling panels is not functioning correctly;

determining whether an area of a support structure divided into areas capable of housing a heat-generating component is housing an operational heat-generating component; and in the case that the area of the support structure is housing an operational heat-generating component, activating a cooling panel adjacent the area of the support structure housing the operational heat-generating component.

17. The computer program product as claimed in claim 16, the method further comprising in the case that the area of the support structure is not housing an operational heat-generating component, deactivating the cooling panel adjacent the area of the support structure.

18. The computer program product as claimed in claim 16, the method further comprising:
determining a position of a non-functioning cooling panel;
determining a position of a non-activated cooling panel adjacent an area of the support structure housing no or a non-operational heat-generating component; and
suggesting moving a heat-generating component from an area of the support structure adjacent a non-functioning cooling panel to an area of the support structure adjacent a previously non-activated functioning cooling panel.

* * * * *